US005602550A

United States Patent [19]

Stein

[11] Patent Number: 5,602,550
[45] Date of Patent: Feb. 11, 1997

[54] APPARATUS AND METHOD FOR LOSSLESS WAVEFORM DATA COMPRESSION

[75] Inventor: Jay M. Stein, Vernon Hills, Ill.

[73] Assignee: Bio-logic Systems Corp., Mundelein, Ill.

[21] Appl. No.: 492,369

[22] Filed: Jun. 19, 1995

[51] Int. Cl.⁶ .................................................. H03M 7/00
[52] U.S. Cl. .............................. 341/76; 341/60; 341/63
[58] Field of Search .............................. 341/50, 60, 63, 341/76, 77, 106

[56] References Cited

U.S. PATENT DOCUMENTS

| | | |
|---|---|---|
| 4,449,536 | 5/1984 | Weaver . |
| 4,579,125 | 4/1986 | Strobl et al. . |
| 4,633,884 | 1/1987 | Imai et al. . |
| 4,777,620 | 10/1988 | Shimoni et al. . |
| 4,802,222 | 1/1989 | Weaver . |
| 4,839,649 | 6/1989 | Imai et al. . |
| 4,882,754 | 11/1989 | Weaver et al. . |
| 4,920,489 | 4/1990 | Hubelbank et al. . |
| 5,049,880 | 9/1991 | Stevens ................................ 341/63 |
| 5,119,092 | 6/1992 | Sumi et al. .......................... 341/60 |
| 5,255,186 | 10/1993 | Steinhaus et al. . |
| 5,260,693 | 11/1993 | Horsley ............................... 341/76 |
| 5,263,486 | 11/1993 | Jeffreys . |
| 5,282,474 | 2/1994 | Valdes Sosa et al. . |
| 5,321,645 | 6/1994 | Konstantinides et al. . |
| 5,333,615 | 8/1994 | Craelius et al. . |

*Primary Examiner*—Howard L. Williams
*Attorney, Agent, or Firm*—Welsh & Katz, Ltd.

[57] ABSTRACT

A method and apparatus for compressing a data vector of a predetermined number of data points. The apparatus includes a memory for storing the compressed data vector, a first comparator for determining a largest and smallest data point of the data vector and a second comparator for comparing the largest and smallest data point and when they are equal, causing a first data point of the data vector to be stored in the memory as the compressed data vector. The apparatus also includes a first processor for determining a data field width necessary to uniquely describe a largest relative magnitude data point and a second processor for storing the data points of the data vector as the compressed vector in data fields of memory of the data field width. The apparatus also includes a comparator and register for creating a difference vector of difference values of adjacent data points of the data vector, a first processor for determining a data field width necessary to uniquely describe a largest magnitude difference value of the difference vector, and a second processor for storing the difference points of the difference vector as the compressed vector in data fields of the memory of the determined field width along with a magnitude and sign of the first data point of the data vector.

36 Claims, 9 Drawing Sheets

APPARATUS AND METHOD FOR LOSSLESS WAVEFORM DATA COMPRESSION

FIELD OF THE INVENTION

The field of the invention relates to data compression and more particularly to apparatus and method of lossless data compression particularly suitable for compression of EEG waveforms.

BACKGROUND OF THE INVENTION

Lossless data compression is known. Lossless data compression may be used where ever a data file must be passed through some sort of process where the process itself limits the volume of the data yet still requires that the data be accurate. Examples of such a process include data storage and retrieval or data transmission systems.

Where the limiting process is data storage and retrieval, the object is to be able to store large amounts of data in a memory device that would otherwise be too small for the data. A processor associated with the memory device first compresses the data under an appropriate compression process for storage within the memory device. The same or another processor may decompress the data using a similar process.

Where the process is a communication system, the data inputs to a voice channel may include a real-time voice signal and control information necessary to maintain the voice channel. The communication system may require a certain information transfer rate for each voice signal on each channel to maintain acceptable voice quality in the presence of a variable rate of control information. Data compression (e.g., Huffman coding) may be used in such a case to pack the control information and voice signal into an allocated spectrum without loss of voice quality.

Where the process is a data transmission system and includes data and control information, exclusively such as for interconnections between computers, then data compression may become even more important. In such cases data compression becomes important not only to reduce the cost of maintaining such connections but also to optimize the value and utility of such connection between geographically diverse data processing and storage facilities.

As an adjunct to the benefits of data communications between computers, data compression has also become important in the area of data storage. Data comprised for purposes of communication may also be stored in the compressed state and vice versa. Improved communication efficiency and storage makes remote storage and retrieval practical at geographically diverse research or manufacturing facilities.

Data compression has also had an impact on small portable data processing devices. As data processors (e.g., laptop, notebook, or palmtop computers) have become smaller and more portable and product features more dependent upon stored software, it often becomes necessary to more efficiently use the higher capacity hard disk drives and floppy disks that have also become available.

Because of the availability of the larger drives, specialized portable data processing devices (e.g., data loggers) have become practical in applications (e.g., electroencephalography, electrocardiography, etc.) not practical in prior years. Analog data, that previously had to be stored under an analog format on an audio tape and later converted to a digital format and processed for relevant information may now be stored digitally. The specialized data loggers now typically process and store the information digitally on a hard disk drive. Unfortunately, data compression methods have not kept pace with the recent developments in data logging.

Lossless data compression is generally implemented using one of two types of modeling. The first of the two types of modeling is referred to as statistical modeling and the other is referred to as dictionary based modeling. Statistical modeling is a compression technique based upon statistical probability of use of a particular symbol in any given time period. The more likely that a particular symbol may be used results in fewer bits being used to describe the symbol.

Statistical modeling (e.g., Huffman coding, Shanon-Fano coding, etc.) is typically based upon use of a look-up table (static model) of compression codes. Compression codes (and the look-up tables containing the compression codes) are often modeled to the type of data that is to be compressed and is often adapted during use.

During use, as each symbol is received by a compressing processor, the symbol is compared with the look-up table and the compression code retrieved and substituted into an output stream in place of the received symbol. The compression code may then be transmitted or stored depending on the process for which compression is being used.

Decompression of data under statistical modeling is also based upon a look-up table. Again, as a compression code is received (i.e., from memory or from a communication receiver) the code is compared with a look-up table. A corresponding symbol is identified from the look-up table and used as an output of the decompression process.

Dictionary based compression schemes are also based upon look-up tables. Dictionary based compression schemes, on the other hand, look for groups of symbols within the look-up table. As input symbols are read, a compressing processor looks for groups of symbols that appear within the dictionary. If a match for the symbol-string is found, a pointer or index identifying the string is output. The longer the match, the better the compression ratio.

Recent improvements in dictionary compression schemes (e.g., LZ77 developed by Jacob Ziv and Abraham Lempel) rely on an adaptive dictionary. Under LZ77 currently received data is compared with a dictionary of previously transmitted data. Where symbol-string matches are found, the matches are encoded as dictionary pointers into the output stream.

Prior compression techniques (i.e., statistical and dictionary compression methods), while effective, are based upon an assumption that the transmitted data has repetitive elements that may be used in compressing the transmitted signal based upon an appropriate algorithm for identifying the repetitive elements. Where the transmitted data does not contain repetitive elements then the prior art compression techniques break down.

In data logging, for instance, where the events logged contain certain random elements (e.g., noise, or other non-repetitive events), compression techniques are not especially effective. Because of the importance of data gathering, a need exists for a compression technique that is effective with nonrepetitive data.

SUMMARY OF THE INVENTION

It is an object of this invention to provide a novel method and apparatus for accomplishing data compression that is both fast and effective with waveform data.

It is a further object of the invention to provide a novel method and apparatus of data compression whose efficiency increases as signal excursion decreases.

It is a further object of the invention to provide a novel method and apparatus of data compression that increases in efficiency as the rate of change of the signal excursion decreases.

It is a further object of this invention to provide a novel method and apparatus of decompressing data previously compressed under the novel process.

These and other objects are provided by a method and apparatus for compressing a data vector of a predetermined number of data points. The apparatus includes a memory for storing the compressed data vector and a first comparator for determining a largest and smallest data point of the data vector. The apparatus further includes a second comparator for comparing the largest and smallest data point and when they are equal, causing a first data point of the data vector to be stored in the memory as the compressed data vector.

The invention further includes novel method and apparatus for compressing a data vector of a predetermined number of data points under an alternate format. The apparatus includes a memory for storing the compressed data vector and a first processor for determining a data field width necessary to uniquely describe a largest relative magnitude data point. The apparatus also includes a second processor for storing the data points of the data vector as the compressed vector in data fields of memory of the data field width.

The invention further includes a novel apparatus for compressing a data vector of a predetermined number of data points under a third alternate format. The apparatus includes a memory for storing the compressed data vector and a comparator and register for creating a difference vector of difference values of adjacent data points of the data vector. A first processor is also included for determining a data field width necessary to uniquely describe a largest magnitude difference value of the difference vector. A second processor is provided for storing the difference points of the difference vector as the compressed vector in data fields of the memory of the determined second field width along with the first data point of the data vector.

Appendix I provides pseudo-code of data compression using each of three possible compression formats.

DESCRIPTION OF A PREFERRED EMBODIMENT

Figure 1:
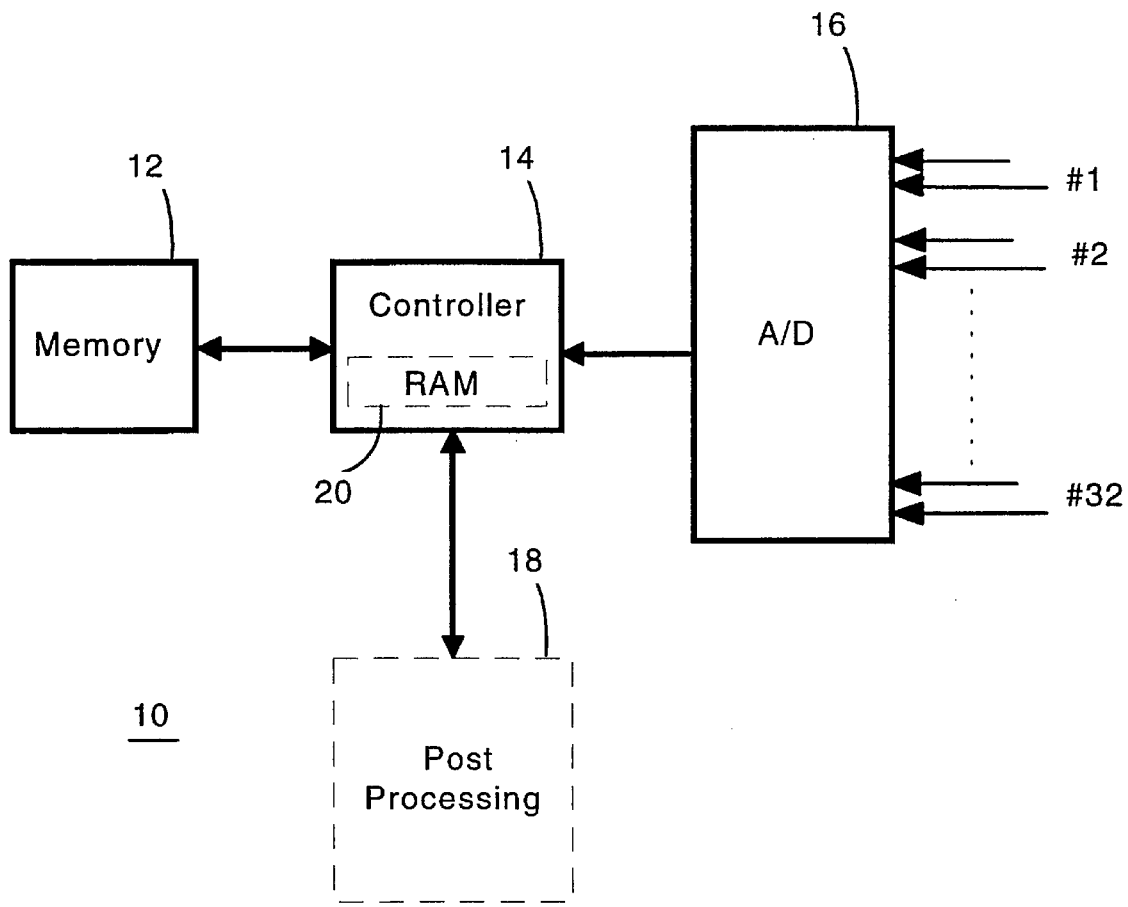
FIG. 1 is a block diagram of an apparatus for performing data compression in accordance with an embodiment of the invention.

FIG. 1 is a block diagram of a data compression system 10, generally, in accordance with an embodiment of the invention. Included within the data compression system 10 is a memory 12, a controller 14, an analog to digital (A/D) converter 16, and an optional post processor 18. The memory 12 may be any appropriate memory mass storage device (e.g., random access memory (RAM), floppy disk drive, a hard disk drive, etc.).

The controller 14 may be any processor operating under any suitable operating system, for example, DOS or UNIX. The A/D converter 16 may be any 32 channel device (e.g., 4 Linear Tech model LTC 1290 connected in parallel) having an appropriate resolution (e.g., 12 bits) and an output buffer (not shown) addressable by the processor 14.

Figure 9:
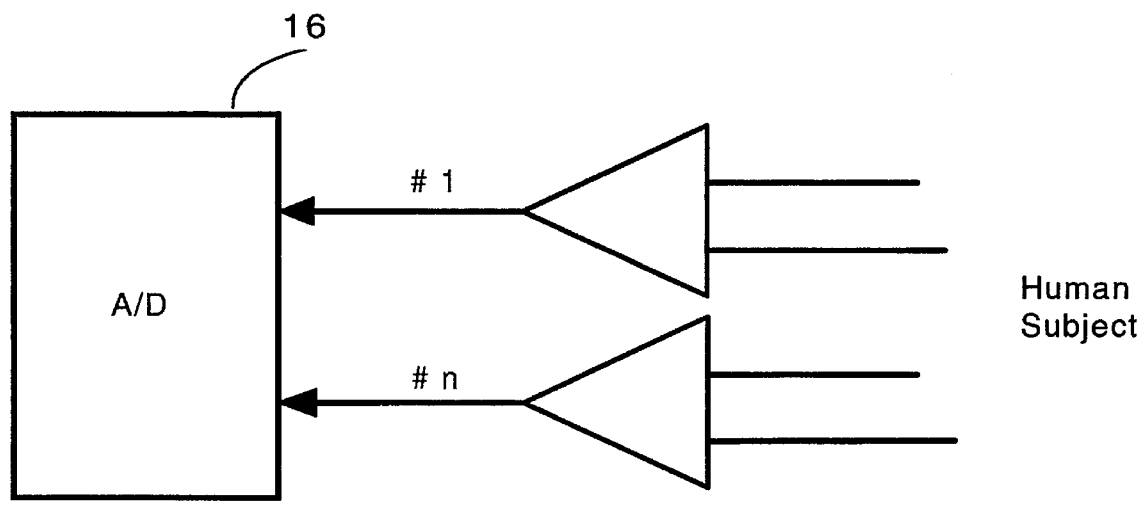
FIG. 9 provides further detail of channel inputs of the apparatus of FIG. 1 when used for data compression of data from a human subject.

The data compression system 10 may be used for biomedical (e.g., EEG, EKG, etc.) monitoring. The data compression system 10 may also be used for any other data activity consistent with the input capabilities of the A/D converter 16 (e.g., seismographic logging, etc.).

Where the data compression system 10 is used for recording EEG data, an appropriate buffer amplifier 15 (e.g., Analog Devices model AD621) may be required to isolate and buffer the input signal. An amplifier 15 in such case is interconnected between the A/D converter 16 and human subject for each input channel (channels #1-n, FIG. 9) used for EEG monitoring.

Under the embodiment, the controller 14 periodically reads the outputs of the A/D converter 16 at a fixed time interval consistent with the conversion time of the A/D converter 16. The readings of each channel of the 32 channels are stored in a separate buffer area within RAM 20 of the controller 14 for subsequent compression and storage within the memory 12.

The controller 14 accumulates readings (data points) from each channel of the A/D converter 16 in a separate channel buffer for a predetermined time period (epoch). Each data point is assumed to be a signed, 2s complement integer, with the least significant bit of the point residing in the least significant bit of the word used to store it. The number of samples in the epoch must be a multiple of the number of bits in a word used to store a sample (e.g., 16). During the epoch the controller 16 may read each channel output of the A/D converter 16 a number of times (e.g., 256) and store the sequentially collected data points in adjacent positions within the channel buffer for that channel. The sequentially collected data points together form a data vector. For purposes of simplicity, the compression process will be described in terms of a single channel. It is to be understood that the compression process may be applied to any number of channels (i.e., 1to 32) for any number of A/D converters 16.

Under the invention, compression may occur under a number of different formats. In each case, an input data vector, temporarily stored in a channel buffer 20a in RAM 20, is converted into a compressed data vector which may then be stored in the mass storage device (i.e., memory 12) or passed to the optional post processor 18. Post processor 18 may be a data manipulation operation or some other volume limited device requiring a compressed stream of input data (e.g., a communication channel).

Under a first format, where the analog input to the A/D converter 16 varies slowly or remains static, the data vector may contain a number of data points that are identical.

Where the data points of the vector are all equal, a single data point may be stored as the compressed data vector along with indicia of format.

Figure 2:
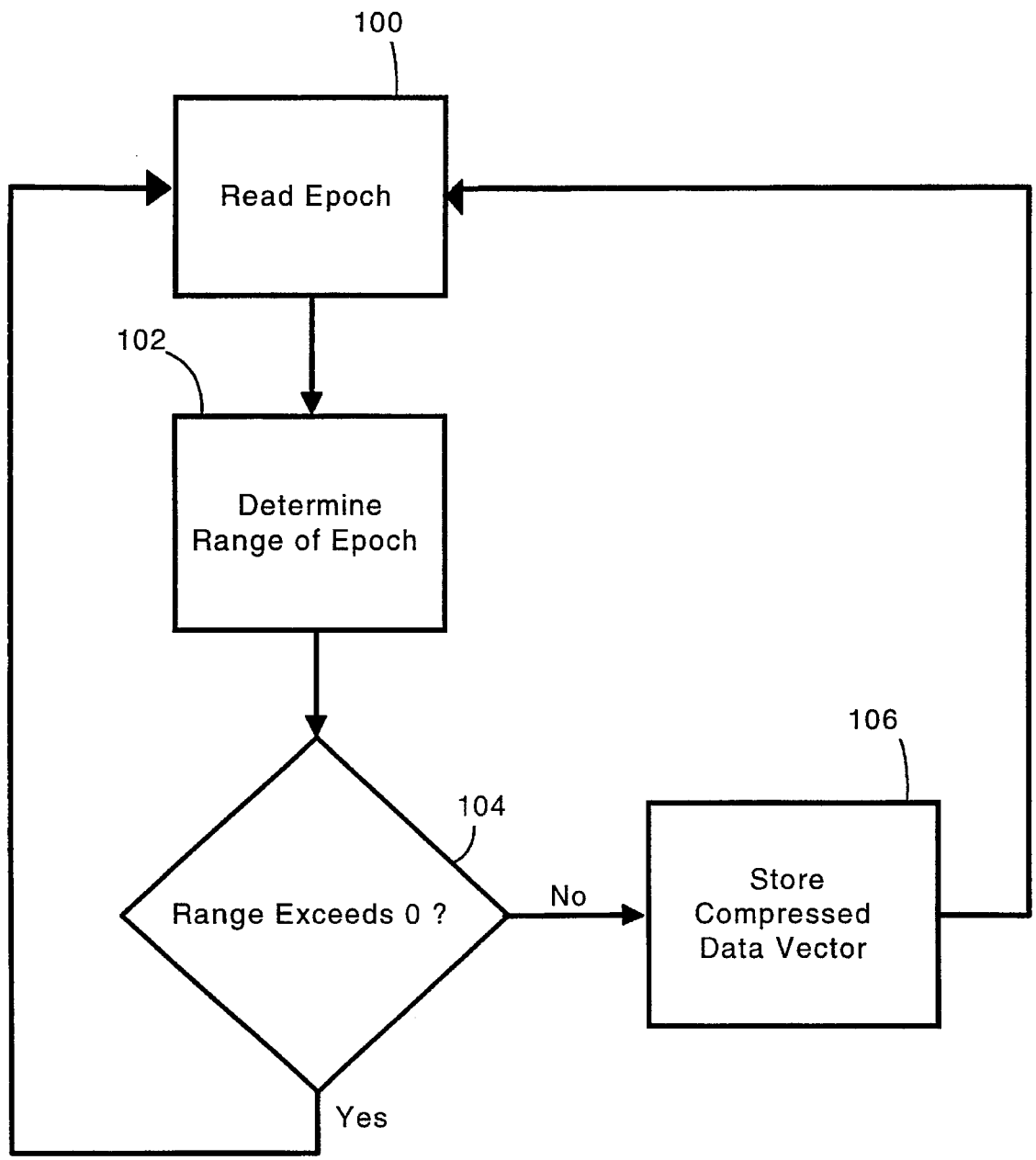
FIG. 2 is a flow chart depicting the steps of data compression under a first format using the apparatus of FIG. 1.

FIG. 2 is a flow chart of data compression under the first format. Under the first format, a data vector of the epoch is read 100 from the input buffer 20a of RAM 20 to determine 102 a range of values of the epoch. Where the range of values is zero (i.e., all values are the same), then the controller 14 stores one of the values (e.g., the first value) of the data vector, along with the indicia of format (e.g., the number "0").

Figure 3:
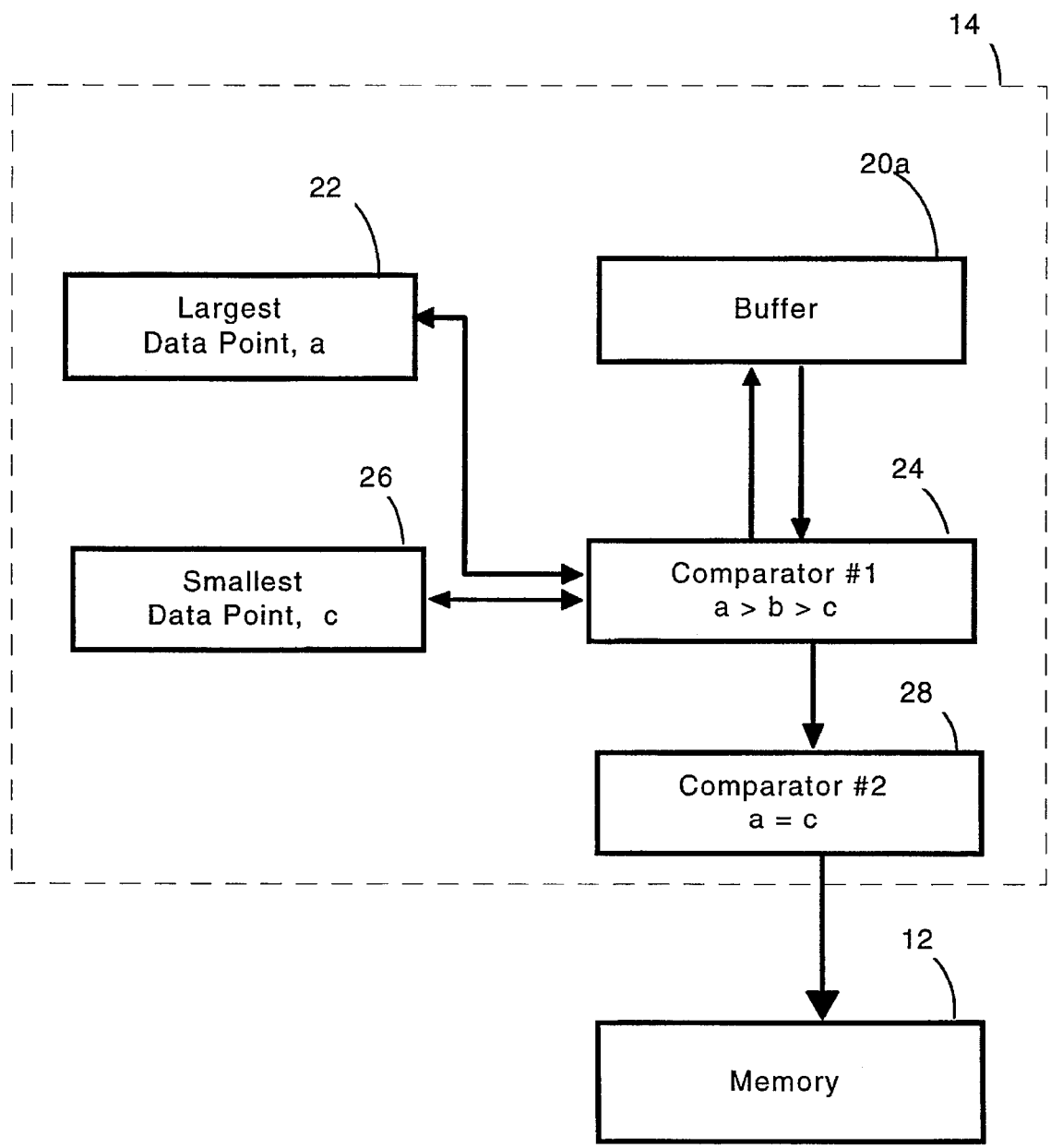
FIG. 3 provides further detail of the apparatus of FIG.1 in accomplishing the process steps of FIG. 2.

FIG. 3 is a block diagram of a specific embodiment of apparatus used for data compression under the first format. As shown a first comparator 24 reads data points of the data vector one at a time while comparing the magnitudes of the data points with the contents of register 22 holding the largest data point and the contents of register 26 holding the smallest data point. Upon determining the largest and smallest data point in the data vector, a second comparator 28 tests whether the smallest point is equal to the largest point. If they are equal, one of the data points is stored with the indicia of the first format.

By way of example, Table 1 shows an example of a data vector having sixteen data points (each equal to a value of 32). The comparator 24 reads the data points from the buffer 20a of RAM 20 one at a time. Upon reading the first data point 32, the comparator 24 stores the magnitude of the first data point in the largest data point register 22 and the smallest data point in register 26. The comparator 24 then proceeds to read and compare each subsequent data point of the data register 20a with the largest and smallest data point registers 22, 26. If a subsequent data point is larger than the value stored in the largest data point register 22, then the larger value is substituted into the larger data point register 22. Likewise, if a smaller data point is found that is smaller than the value in the smallest data point register 26, then that value is substituted into the smaller data point register 26.

Upon completion of a determination of the largest and smallest data points within the first comparator 24, a comparison is made between them. If they are equal (i.e., 32=32) then one of the data points is stored along with the indicia (i.e., 0) of the first format.

TABLE I

| | |
|---|---|
| INPUT: | 32 32 32 32 32 32 32 32 32 32 32 32 32 32 32 32 |
| MIN: | 32 |
| MAX: | 32 |
| MIN = MAX, so store only one data point, 32. | |
| OUTPUT: | 0 32 |

Appendix I contains a summary of data compression under the invention. Reference will be made to Appendix I as appropriate to an understanding of the invention.

Turning now to the second and third formats, examples will be offered of each format along with examples of how one format is selected over the over. However, because of the similarities, the processes will be described together.

Figure 4:
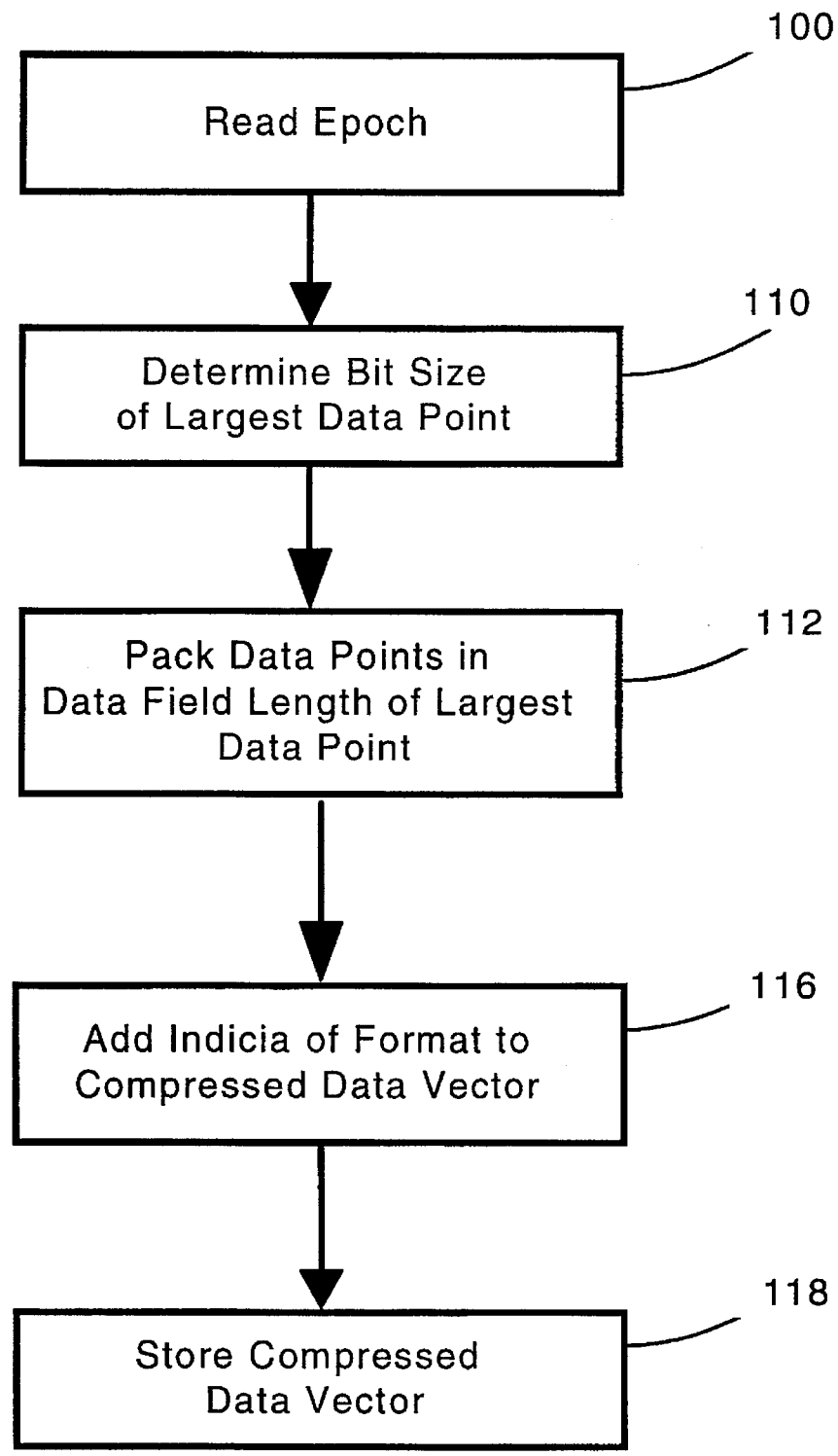
FIG. 4 is a flow chart depicting the steps of data compression under a second format using the apparatus of FIG. 1.
Figure 5:
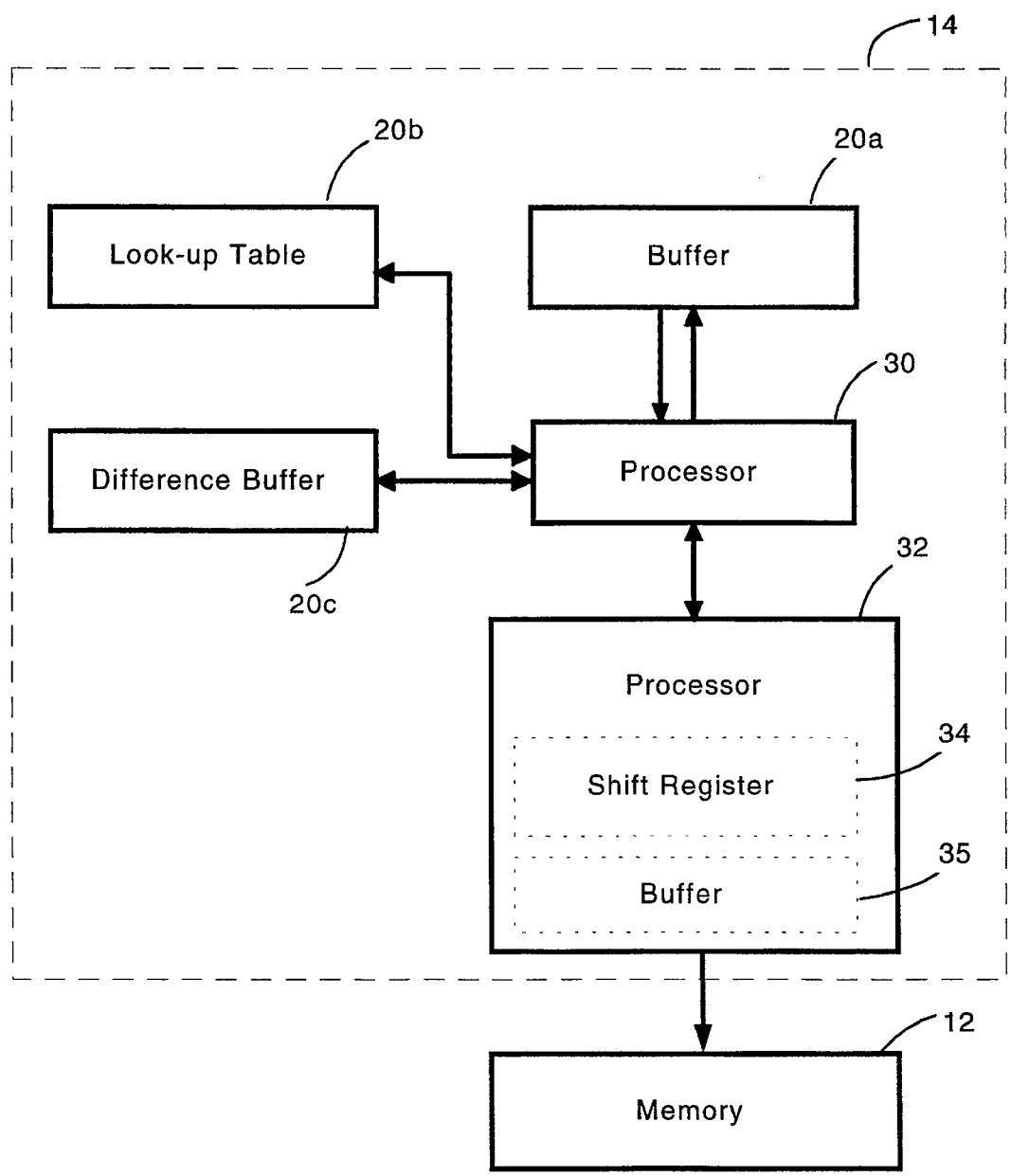
FIG. 5 provides further detail of the apparatus of FIG.1 in accomplishing the process steps of FIG. 4.
Figure 6:
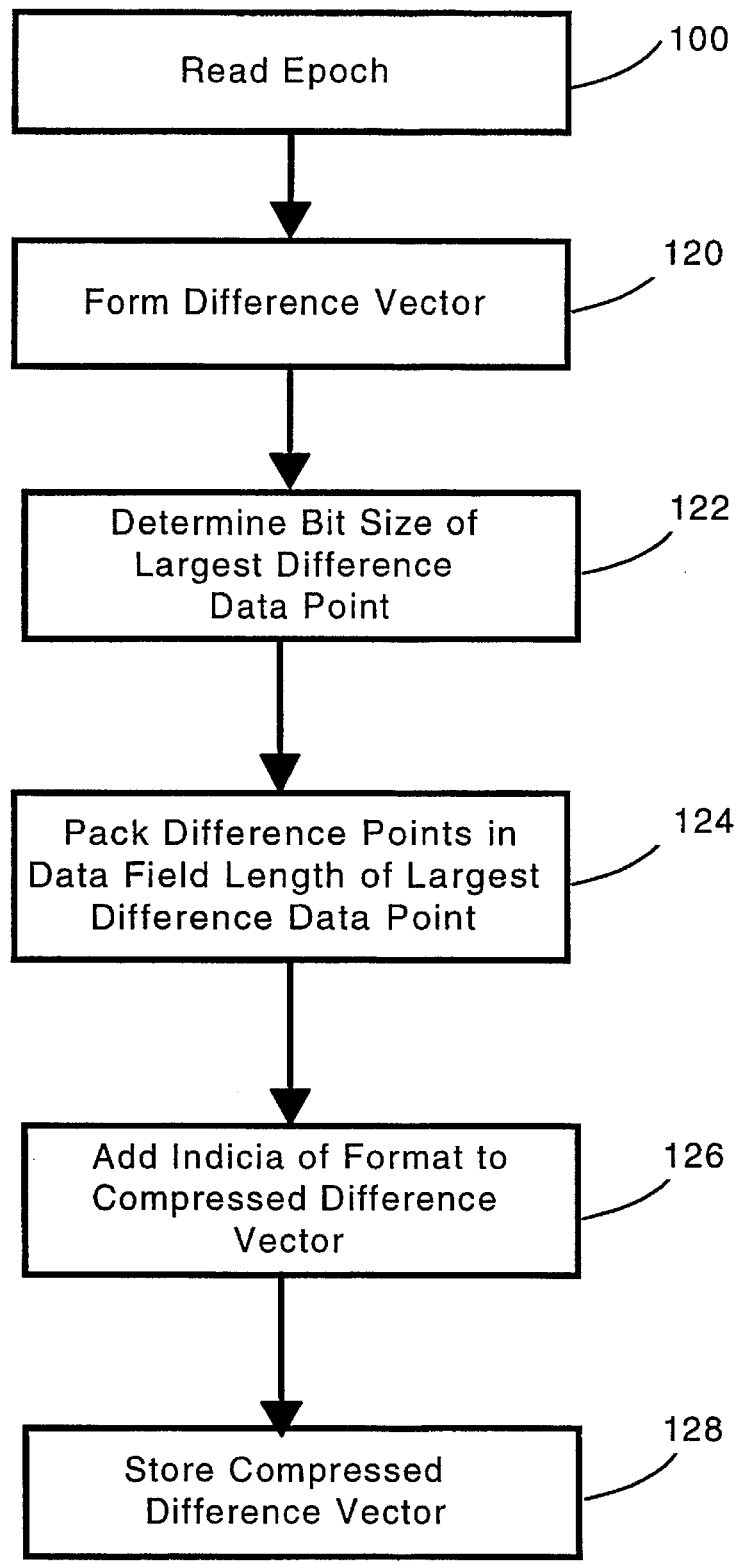
FIG. 6 is a flow chart depicting the steps of data compression under a third format using the apparatus of FIG. 1.
Figure 7:
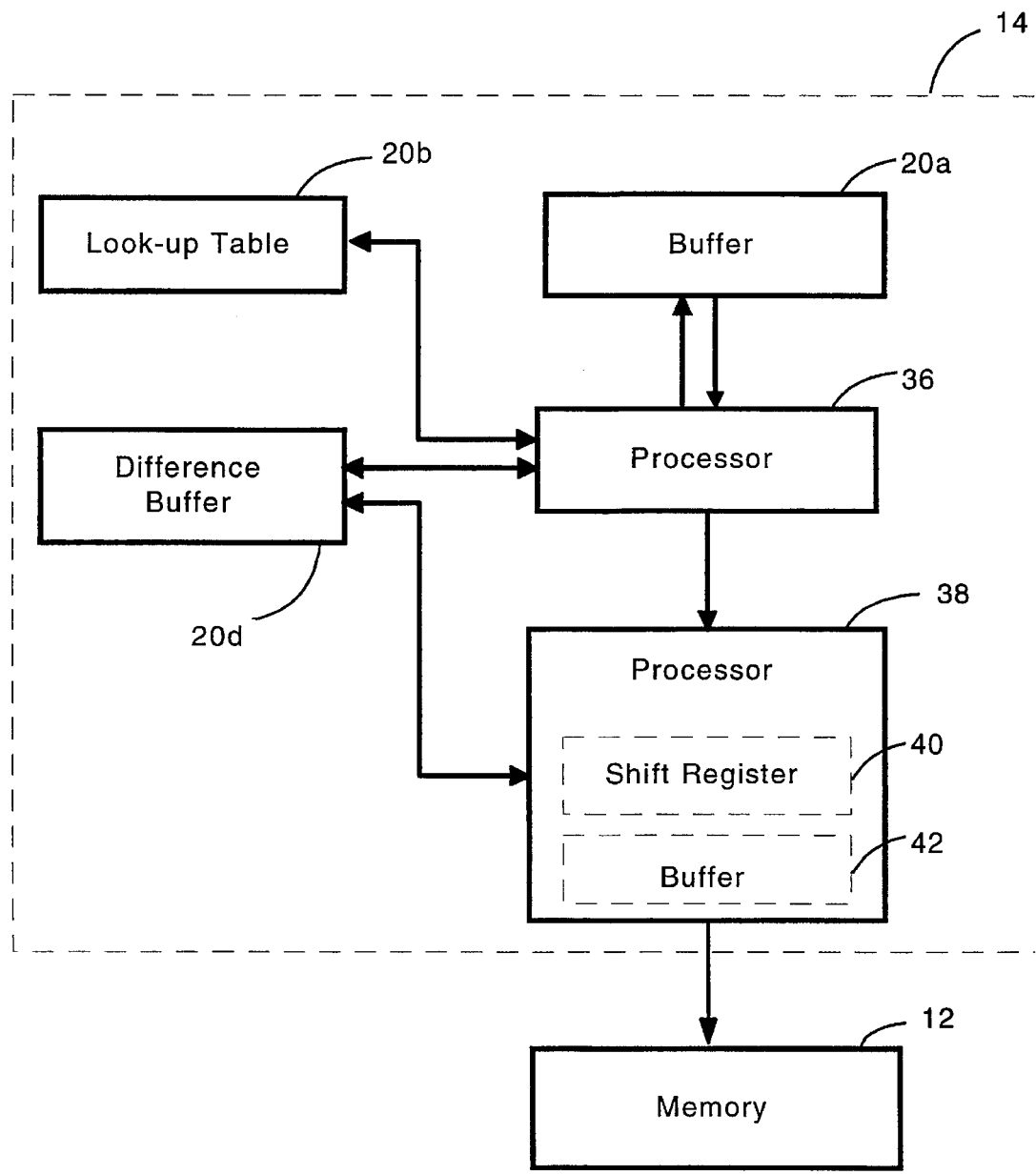
FIG. 7 provides further detail of the apparatus of FIG.1 in accomplishing the process steps of FIG. 6.

Table II and FIGS. 4 and 5 will be used to describe data compression under the second format along with the decision points of how the second format is selected over the third format. Similarly, Table III and FIGS. 6 and 7 will be used to describe data compression under the third format along with how the third format is selected over the second format.

As shown in the example of Table II, the 16 input data points of the data vector range from 12 to −1. Since the largest point (12) is not equal to the smallest point (−1), the first format cannot be used.

To determine the format to be used for the data of Table II, a difference vector is determined for adjacent data points. The difference vector is determined by subtracting an adjacent data point on the left from a data point on the right. For the data shown in the top line of Table II, the first difference point of the difference vector (shown opposite the word "DIFFERENCES") is determined by the equality 0−12=−12. The second data point of the difference vector is determined by the equality 0−0=0. The third difference point is determined by the difference (−1)−0=−1, etc.

A maximum and minimum value of the data vector were already utilized to determine that the first format could not be used. From these determinations, the number of bits necessary to describe each data point is determined from the magnitude of each. A minimum and maximum value of the difference vector are also determined, and from these the number of bits necessary to describe each difference value. In the example shown in Table II the number of data bits is 5 (with a fifth bit provided for sign). The number of difference bits is also 5. Since the bits of the data vector is the same as the bits of the difference vector the system selects the second format for compressing the data vector.

FIG. 5 is a simplified block diagram depicting apparatus for compressing data under the second format. Under the second format, data points of the data vector are retrieved from the buffer 20a of RAM 20 one at a time for determining a proper format. The processor 30 stores the data point in a data point register of buffer 20c.

The processor 30 next retrieves the next data point. If the second data point is larger than the first data point, then the data point stored in the data point register in buffer 20c is replaced. The processor 30 also subtracts the first data point from the second data point and stores the difference as a difference point in a first storage location of a difference vector buffer of buffer 20c and also in a largest difference point data register 20c.

A third data point is retrieved from the data vector stored in buffer 20a. Again, if the third data point is larger than that stored in the data point register in the buffer 20c the third data point is stored in the data point register.

The second data point is subtracted from the third data point. The difference is stored as the second difference point in the difference vector stored in the buffer 20c. The second difference point is compared with the value in the largest difference point and, if larger, is stored in the largest difference point register in buffer 20c.

The process repeats for data points 4–16 each time determining a maximum value for the data vector and the difference vector. Upon determining the largest data point of the data vector and the largest difference point of the difference vector, the processor 30 determines a data bit size for the largest point of the data vector and a difference bit size for the largest difference point through use of a first series of inequalities (e.g., Appendix I, Algorithms 3 and 4) or by reference to a look-up table. The processor 30 compares the data bit size with the difference bit size. If the data bit size is less than, or equal to, the difference bit size, then the second format is chosen for compression, otherwise the third format is chosen.

In the example shown in Table II, the data bit size is 5 and the difference bit size is also 5. Since the data bit size is the same as the difference bit size, the second format of compression is chosen.

To create a compressed data vector the processor 32 stores 116 an indicia of format in a first word of the compressed data vector. Under the embodiment, the indicia of the second format may be a positive numerical value equal to the data bit size. In the case of the example of Table II, a value of 5 is stored in the first word of the compressed data vector.

The steps used to compress the data points of the data vector into the compressed data vector are dependent upon the data bit size. Appendix I, Algorithm 5 indicates compressed data point position within the compressed vector as well as compressed data vector size for a number of bit sizes. For example, if the data bit size were one bit, then the first data point would occupy position "0" on the far left side of the compressed vector as indicated in Appendix I, Algorithm 5. Likewise, the information of the second data point would occupy the second bit position (labeled "1"). The remaining data points of the data vector would successively occupy other positions to the right up to the final positions (i.e., "F"), which is occupied by the information of the sixteenth data point.

For the example of Table II, the bit size is shown to be 5 bits. From Appendix I, Algorithm 5, a bit size of 5 is shown to require 5 data words for storage of the data points of the data vector in a compressed vector. Since the significant bits of a number of data points must be packed 112 into each word of the compressed data vector, a number of bit shifting operations are required for creation of the compressed data vector.

To create a compressed data vector using the example of Table II, a processor 30 (as noted above) first reads 100 and determines 110 the bit size (i.e., 5) of the largest data point of the data vector. After determining that the second format of data compression is to be used, the processor 30 may store the indicia of format (i.e., 5) directly into a first word of an allocated compressed data vector location in memory 12 or may piece together the entire compressed data vector within a compressed data vector register of the buffer 20c, first, and later store the entire compressed data vector into memory 12.

In either case the processor 30 determines a data bit size and allocates a field length (i.e., several words of memory) to the completed compressed data vector based upon the determined data bit size. The processor then stores the indicia of format and compressed data into the allocated field length.

To compress the data points the processor 32 loads a first data point and masks off the 11 0bits to the left of the bits designated by the data bit size. The processor 32 then shifts the remaining (unmasked) bits to the far left (i.e., by 11 bits, to the positions labeled "0" in Appendix I, Algorithm 5) and stores the result in a first word of a data buffer 35 of the processor 32. The processor 32 then loads a second data point, masks off the 11 bits to left and shifts the remaining bits 6 bits to the left before storing in the buffer 35. The third data point is masked and shifted one bit to the left before storing in the buffer 35. The fourth data point is loaded, masked and shifted four bits to the right, resulting in three bits (i.e., the right three data bits of the fourth data point) being shifted out of the shift register. The remaining bit of the fourth masked data point is then stored in the buffer 35 in the right-most data position.

The masking and shifting described to this point has resulting in the completion of a second word of the compressed data vector (the first word is occupied by the indicia of format). The completed second word of the compressed data vector may now be stored in memory 12 or in the buffer 20c.

The second word of compressed data of the compressed data vector begins by again loading the fourth data point. Again, the 11 left-most bits are deleted by masking. The remaining 5 masked bits are now shifted 12 bits to the left (resulting in one bit being shifted out of the register) and stored in the buffer 35 to begin constructing the third word of the compressed data vector. The fifth data point is loaded, masked, shifted 7 bits to the left, and stored. The sixth data point is loaded, masked, and shifted 2 bits to the left. The final data point of the second word of the compressed data (i.e., the seventh data point) is loaded, masked, shifted 3 bits to the right and stored in the remaining bit locations of the buffer 35. The processor 32 then writes the second word of the compressed data into the third word location of the compressed data vector.

The eighth through sixteenth data points are similarly masked and shifted and stored. The bottom row of Table II (labeled "OUTPUT") summarizes the stored number for the example of Table II. Shown in Table II is the INPUT DATA before and after reduction to 5 bit binary, in accordance with the process. At the bottom of Table II the five bits of each data point of the reduced data vector is shown packed into binary words. The first word (i.e., the indicia of format) of the compressed data vector (i.e., 5) indicates the number of significant bits and the sign indicates the second format.

TABLE II

| INPUT: | 12 0 0 −1 0 −1 0 −1 0 −1 0 −1 0 −1 0 −1 |
|---|---|
| MAX: | 12 |
| MIN: | −1 |
| BITS: | 5 |
| DIFFERENCES: | −12 0 −1 1 −1 1 −1 1 −1 1 −1 1 −1 1 −1 |
| MAX: | 1 |
| MIN: | −12 |
| BITS: 5 | |

5 <= 5, so 5 bit compression of original data will be used.

INPUT DATA

| Decimal | 16 bit binary | 5 bit binary |
|---|---|---|
| 12 | 0000000000001100 | 01100 |
| 0 | 0000000000000000 | 00000 |
| 0 | 0000000000000001 | 00001 |
| −1 | 1111111111111111 | 11111 |
| 1 | 0000000000000001 | 00001 |
| −1 | 1111111111111111 | 11111 |
| 1 | 0000000000000001 | 00001 |
| −1 | 1111111111111111 | 11111 |
| 1 | 0000000000000001 | 00001 |
| −1 | 1111111111111111 | 11111 |
| 1 | 0000000000000001 | 00001 |
| −1 | 1111111111111111 | 11111 |
| 1 | 0000000000000001 | 00001 |
| −1 | 1111111111111111 | 11111 |
| 1 | 0000000000000001 | 00001 |
| −1 | 1111111111111111 | 11111 |

5 BIT DATA PACKED INTO 16 BIT WORDS

| 16 bit binary | Decimal |
|---|---|
| 0110000000000011 | 24579 |
| 1111000011111100 | −3844 |
| 0011111100001111 | 16143 |
| 1100001111110000 | −15376 |
| 1111110000111111 | −961 |

OUTPUT: 5  24579  −3844  16143  −15376  −961

Table III offers a further example of data compression under the third format. For the example shown in Table III, the bit size necessary to express the difference vector as a reduced difference vector is smaller than the number of bits necessary to express the data vector as a reduced data vector.

Since the number of bits of the reduced difference vector is less than the reduced data vector, the third format is used and the reduced difference vector is packed into binary words and stored as shown, along with indicia of compression. The indicia of compression in this case is −1. The digit 1 is indicative of the number of bits and the negative sign is indicative of the third format.

By reference to Appendix I, Algorithm 5, it is clear that with a bit size of 1 bit, the compressed data vector now requires one 16 bit memory location. The processor, accordingly, allocates 3 words of memory (1 for the compressed data, 1 for the first data value and 1 for the indicia of format).

As in the previous example, the processor 36 (FIG. 7) determines a bit size for the largest data point of the data vector shown in the top line of Table III. The controller also creates a difference vector (by subtracting the first data point from the second, the second from the third, etc.) and stores the difference vector in the buffer 20$d$. The controller determines a bit size for the difference vector and compares the difference bit size with the data bit size. Since the difference bit size is less than the data bit size, the processor 36 determines that the third format is to be used in data compression for the data vector shown at the top of Table III.

The processor 38 may begin constructing the compressed data by storing the indicia of format (i.e. −1) in the first word of the compressed data vector. The processor 38 also stores a value (e.g., the magnitude of the first data point) upon which the data vector can be reconstructed from the compressed data vector (which in this case is the stored, compressed difference vector). The processor 38 provides the value by storing the first data point (i.e., 32) in the second word of the compressed data vector.

Packing 124 the difference points of the difference vector into word 3 of the compressed data vector occurs in a manner substantially identical to the process described above. The processor 38 loads a difference point of the difference vector from the buffer 20$d$, masks off the bits outside the determined bit size, and shifts to an appropriate position, as indicated in Appendix I, Algorithm 5. The shifted masked bits are then stored in the word buffer 42. Upon completion of each word of the compressed data vector, the vector is stored in memory 12.

TABLE III

| | |
|---|---|
| INPUT: | 31 30 30 29 28 27 27 26 25 24 24 23 22 21 21 20 |
| MAX: | 31 |
| MIN: | 20 |
| BITS: | 7 |
| DIFFER-ENCES: | −1 0 −1 −1 −1 0 −1 −1 −1 0 −1 −1 −1 0 −1 |
| MAX: | 0 |
| MIN: | −1 |
| BITS: | 1 |

1 < 7, so 1 bit compression of difference data will be used

DIFFERENCE DATA

| Decimal | 16 bit binary | 1 bit binary |
|---|---|---|
| −1 | 1111111111111111 | 1 |
| 0 | 0000000000000000 | 0 |
| −1 | 1111111111111111 | 1 |
| −1 | 1111111111111111 | 1 |
| −1 | 1111111111111111 | 1 |
| 0 | 0000000000000000 | 0 |
| −1 | 1111111111111111 | 1 |
| −1 | 1111111111111111 | 1 |
| −1 | 1111111111111111 | 1 |
| 0 | 0000000000000000 | 0 |
| −1 | 1111111111111111 | 1 |
| −1 | 1111111111111111 | 1 |
| −1 | 1111111111111111 | 1 |
| 0 | 0000000000000000 | 0 |
| −1 | 1111111111111111 | 1 |
| 0 | 0000000000000000 | 0 (place holder) |

1 BIT DIFFERENCE PACKED INTO A 16 BIT WORD

| 16 bit binary | Decimal |
|---|---|
| 1011101110111010 | −17478 |

OUTPUT: −1  31  −17478

Figure 8:
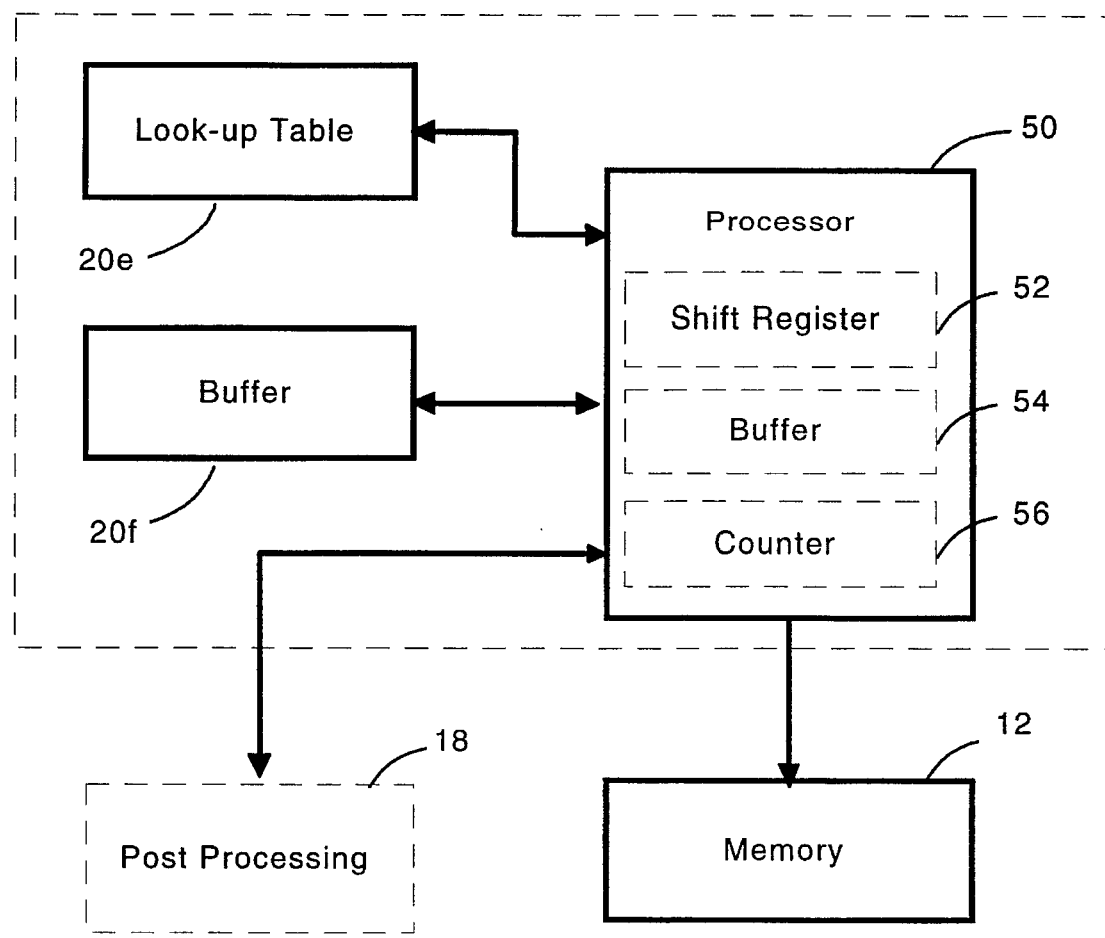
FIG. 8 provides further detail for the apparatus of FIG.1 in accomplishing data decompression.

Decompression under the embodiment is accomplished by a reversal of the process described above. Under the embodiment, the processor 50 (FIG. 8) reads a compressed data vector and may store the vector in the buffer 54. The processor then reads the first data word (indicia of format) to determine the process to be used in decompression and proceeds accordingly.

Where the compressed data vector contains an indicia of a first format (i.e., a zero), the processor 50 recognizes the vector by reference to the look-up table 20$e$ as a compressed data vector stored under the first format. The processor 50 accordingly sets an internal counter 56 equal to 16 the number of words in the uncompressed vector. The processor reads the second word of the compressed data vector into an internal buffer 54 and begins outputting a decompressed data stream to the post processor 18 based upon the contents of the buffer 54. Each time the processor 50 outputs the contents of the buffer 54, the processor 50 decrements the counter 56. When the counter 56 reaches zero, the processor reads another compressed data vector.

Upon reading the next compressed data word, the processor again inputs the first data word providing the indicia of format (e.g., the value of 5 as in the case of Table II). The processor by reference to the look-up table 20$e$ determines that the compressed data vector is stored under the second format and proceeds accordingly.

The processor 50 reads the second word of the compressed data vector (first data word) into the buffer 54. The contents are then transferred to the shift register 52 for unpacking. To recover the first data point the processor shifts the contents of the shift register to the right by 11 bits. Note that in the above, shifting to the right is done, with sign extension, so that signed values are produced. (Sign extension means that after a signed number is shifted to the right, the most significant bit of the original word is copied to the most significant bit of the shifted word. This function is an integral part of a 2s compliment processor.) The contents of the shift register 52 is then transferred to the post processor 18 as a decompressed first data point of the first data vector.

To decompress the second data point the processor 50 again transfers the contents of the buffer 54 to the shift register 52. This time, the processor 50 causes the shift register to shift left by 5 bits and then right by 11 bits. The contents of the shift register 52 is then provided to the post processor 18 as the second data point of the data vector.

Unpacking the third data point of the data vector is more complicated. Reference to Appendix I, Algorithm 5 shows that the third data point resides within two different words of the compressed data vector.

To unpack the third data word the processor 50 again loads the contents of the buffer (second word of the compressed data vector) into the shift register and shifts left 15 bits. The shifted contents of the shift register 52 may then be temporarily stored in the buffer 20$f$ as a partial data point while the remainder of the third data word is recovered.

The processor 50 then loads the third word of the compressed data vector into the buffer 54 and into the shift register 52. The shift register may then be shifted to the right by one bit to produce an interim result and to make room for the remaining bit of the previous word (i.e., the partial data point) stored in the buffer 20$f$. The remaining bit may be appended to the contents of the shift register 52 by logically "OR"ing the contents of the shift register 52 with the partial data point stored in the buffer 20$f$. The contents of the shift register is then shifted 11bits to the right to complete the unpacking of the third data point. The third data point of the data vector is then output to the post processor 18.

Similarly the fourth data point is unpacked by loading the third word of the compressed data vector into the shift register, shifting to the left by 4 bits, followed by shifting to the right by 11 bits. The fifth data point is unpacked by loading the third word of the compressed data vector into the shift register, shifting to the left by 9 bits, followed by shifting to the right by 11 bits.

The sixth data point is again divided between two compressed data words and a partial data point must again be stored in buffer 20f and again logically "OR"ed with the next interim result before finally shifting the entire contents to produce the final result of the sixth data point.

The seventh through sixteenth data points are similarly unpacked. The unpacked data points are sequentially transferred to the post processor 18.

Upon completing the unpacking of the compressed data vector, the processor 50 may retrieve another compressed data vector. Again, the processor 50 first retrieves the first word as the indicia of format. The indicia is determined by comparison of the first word with the contents of an indicia look-up table 20e. Where the indicia is negative, the processor 50 determines that the compressed data vector is stored under the third format and uses the number associated with the indicia as a bit length of the difference vector stored after the second data word of the compressed data vector.

After determining that the compressed data vector is stored under the third format, the processor 50 reads the second data word. Since the second data word stored under the third format is a magnitude of the first data point, it can be output to the post processor 18 without unpacking. A copy of the first data word, however, must be stored in the buffer 20f as a reference data word for a determination of the second data word.

To evaluate the second data word (and subsequent data words) the difference vector must be unpacked from the third and subsequent words of the compressed data vector. The processor 50 unpacks the difference vector through use of the shift register 52 and the bit size recovered from the indicia of format. Following the reconstruction of the difference vector, the original data vector can be recreated by adding the first data point to the first difference point and the result to subsequent difference points.

For the example provided in Table III, the indicia of format (i.e., −1) indicated a difference vector bit length of 1 bits. The controller reads the third word of the compressed data vector. By reference to Appendix 1, Algorithm 5, it may be seen that to recover the first difference value of the difference vector the processor 50 simply causes the shift register 52 to shift right by 15 bits. The result is the transferred to a first difference location within a difference vector register in buffer 20f.

To recover the second difference point, the processor 50 reads the third data word into the shift register 52. The controller 50 then causes the shift register 50 shift left by 1 bit and then right by 15 bits. The result is then stored in a second difference location within the difference vector register in buffer 20f.

To recover the third difference point, the processor 50 again reads the third data word into the shift register 52. This time, the controller 50 causes the shift register to shift left by 2 bits and then right by 15 bits. The result is then stored in a third difference location within the difference vector register in buffer 20f. Difference points 4–16 are recovered in a similar manner.

To recreate the second data point of the data vector, the first data point is read from the buffer 20f and added to the first difference point of the difference vector. The result is output to the post processor 18 and stored as a new reference data point.

Similarly the third data point is evaluated by adding the new reference point to the second difference point of the difference vector. The result is output as the third data point and, also, stored as the new reference data point. Subsequent data points are evaluated in an identical manner.

A specific embodiment of novel methods and apparatus of compressing data according to the present invention have been described for the purpose of illustrating the manner in which the invention is made and used. It should be understood that the implementation of other variations and modifications of the invention and its various aspects will be apparent to one skilled in the art, and that the invention is not limited by the specific embodiments described. Therefore, it is contemplated to cover the present invention any and all modifications, variations, or equivalents that fall within the true spirit and scope of the basic underlying principles disclosed and claimed herein.

APPENDIX I

NOMENCLATURE point: A digitized voltage. Here, it will be assumed that the data point is a signed, twos complement word.

vector: A sequence of words.

Bw: The number of bits in a word (here assumed to be 16).

Ba: The number of significant bits needed to represent either min_data or max_data.

Bd: The number of significant bits needed to represent either min_diff or max_diff.

B: The number of bits (Ba or Bd) used to compress a vector.

n: The number of words in the original vector, a multiple of Bw. For sampled EEG, one second of data is appropriate. For EEG data sampled at 256 Hz and Bw=16, n=256.

p: The number of words produced by a low level packing algorithm.

m: The number of words in the compressed vector

A1..An: Vector of data points. For multichannel sampled data, each vector contains data from one of the channels.

D1..Dn: Difference vector; the differences between successive data points (Dn is always 0).

P1..Pp: Output of low level packing algorithm.

C1..Cm: Compressed vector containing compression type, P1..Pp, and, possibly, an uncompressed data point.

min_data, max_data: most negative and most positive points in A1..An. min_diff, max_diff: most negative and most positive points in D1..Dn.

ALGORITHM 1: DETERMINE THE MOST POSITIVE AND MOST NEGATIVE POINTS
IN THE ORIGINAL DATA
INPUT: A1..An, n
OUTPUT: min_data, max_data
min_data=A1
max_data=A1
i=2
while (i <=n)
    if Ai<min_data then min_data=Ai
    if Ai>max_data then max_data=Ai
    i=i+1

ALGORITHM 2: DETERMINE THE MOST POSITIVE AND MOST NEGATIVE POINTS IN THE DIFFERENCE DATA

INPUT : D1..Dn, n

OUTPUT: min_diff, max_diff min_diff=D1 max_diff=D1 i=2 while ( i<n )
  if Di<min_diff then rain diff=Di
  if Di>max diff then max_diff=Di i=i+1

ALGORITHM 3: SELECT BITS FOR THE ORIGINAL DATA

INPUT : min_data, max_data

OUTPUT: Ba

NOTE: NOT means that all 0s in the word become is and all is in the word become 0s.

If (NOT(max_data)<min_data) then min_data=NOT(max_data)
  If min_data>=−1 then Ba =1
  else if min_data>=−2 then Ba=2
  else if min_data>=−4 then Ba=3
  else if min_data>=−8 then Ba=4
  else if min_data>=−16 then Ba=5
  else if min_data>=−32 then Ba=6
  else if min_data>=−64 then Ba=7
  else if min_data>=−128 then Ba=8
  else if min_data>=−256 then Ba=9
  else if min_data>=−512 then Ba=10
  else if min_data>=−1024 then Ba=11
  else if min_data>=−2048 then Ba=12
  else if min_data>=−4096 then Ba=13
  else if min_data>=−8192 then Ba=14
  else if min_data>=−16384 then Ba=15
  else Ba=16

ALGORITHM 4: SELECT BITS FOR THE DIFFERENCE DATA

INPUT: min_diff, max_diff

OUTPUT: Bd

If (NOT(max_diff)<min_diff) then min_diff=NOT(max_diff)
  If min_diff>=−1 then Bd=1
  else if min_diff>=−2 then Bd=2
  else if min_diff>=−4 then Bd=3
  else if min_diff>=−8 then Bd=4
  else if min_diff>=−16 then Bd=5
  else if min_diff>=−32 then Bd=6
  else if min_diff>=−64 then Bd=7
  else if min_diff>=−128 then Bd=8
  else if min_diff>=−256 then Bd=9
  else if min_diff>=−512 then Bd=10
  else if min_diff>=−1024 then Bd=11
  else if min_diff>=−2048 then Bd=12
  else if min_diff>=−4096 then Bd=13
  else if min_diff>=−8192 then Bd=14
  else if min_diff>=−16384 then Bd=15
  else Bd=16

ALGORITHM 5: PACK A VECTOR

INPUT : A1..An or D1..Dn, B, n

OUTPUT: P1..Pp

Find the entry corresponding to B in the Packing Algorithm Look-up Table, and execute that algorithm. The following table and patterns are for compressing 16 bit words (Bw=16).

| PACKING ALGORITHM LOOK-UP TABLE | |
|---|---|
| B | Algorithm |
| 0 | ALGORITHM 5.0 |
| 1 | ALGORITHM 5.1 |
| 2 | ALGORITHM 5.2 |
| 3 | ALGORITHM 5.3 |
| 4 | ALGORITHM 5.4 |
| 5 | ALGORITHM 5.5 |
| 6 | ALGORITHM 5.6 |
| 7 | ALGORITHM 5.7 |
| 8 | ALGORITHM 5.8 |
| 9 | ALGORITHM 5.9 |
| 10 | ALGORITHM 5.10 |
| 11 | ALGORITHM 5.11 |
| 12 | ALGORITHM 5.12 |
| 13 | ALGORITHM 5.13 |
| 14 | ALGORITHM 5.14 |
| 15 | ALGORITHM 5.15 |
| 16 | ALGORITHM 5.16 |

Each of these low level compression algorithms processes vectors 16words at a time, because the patterns of bit fields repeat every 16 fields. Each algorithm consists of the shifts, ANDs and ORs needed to extract the significant bits from the input vector and pack them into the output vector using one of the patterns below.

In each patern, the sequence of 0's is the bit field for A1, A17,...
the sequence of 1's is the bit field for A2, A18,...
the sequence of 2's is the bit field for A3, A19,...
.   .   .
.   .   .
.   .   .
the sequence of 9's is the bit field for A10, A26,...
the sequence of A's is the bit field for A11, A27,...
.   .   .
.   .   .
.   .   .
and the sequence of F's is the bit field for A16, A32,...

| ALGO-RITHMS | | PATTERN | RATIO |
|---|---|---|---|
| 5.0, 6.0 | 0 bit | 0000000000000000 | n:1 |
| 5.1, 6.1 | 1 bit | 0123456789ABCDEF | 16:1 |
| 5.2, 6.2 | 2 bit | 0011223344556677 | 16:2 |
| 5.3, 6.3 | 3 bit | 0001112223334445 55666777888999AA ABBBCCCDDDEEEFFF | 16:3 |
| 5.4, 6.4 | 4 bit | 0000111122223333 4444955566667777 88889999AAAABBBB CCCCDDDDEEEEFFFF | 16:4 |
| 5.5, 6.5 | 5 bit | 0000011111222223 3333444445555566 6667777788888999 99AAAAABBBBBCCCC CDDDDDEEEEEFFFFF | 16:5 |
| 5.6, 6.6 | 6 bit | 0000001111112222 2233333344444455 5555666666777777 888888999999AAAA AABBBBBBCCCCCCDD DDDDEEEEEEFFFFFF | 16:6 |
| 5.7, 6.7 | 7 bit | 0000000111111122 2222233333334444 4445555555666666 6777777788888889 999999AAAAAAABBB BBBBCCCCCCCDDDDD DDEEEEEEEFFFFFFF | 16:7 |
| 5.8, 6.8 | 8 bit | 0000000011111111 2222222233333333 | 16:8 |

| ALGO-RITHMS | | PATTERN | RATIO |
|---|---|---|---|
| | | 4444444455555555 | |
| | | 6666666677777777 | |
| | | 8888888899999999 | |
| | | AAAAAAAABBBBBBBB | |
| | | CCCCCCCCDDDDDDDD | |
| | | EEEEEEEEFFFFFFFF | |
| 5.9, 6.9 | 9 bit | 0000000001111111 | 16:9 |
| | | 1122222222233333 | |
| | | 3333444444444555 | |
| | | 5555556666666667 | |
| | | 7777777788888888 | |
| | | 8999999999AAAAAA | |
| | | AAABBBBBBBBBCCCC | |
| | | CCCCCDDDDDDDDDEE | |
| | | EEEEEEEFFFFFFFFF | |
| 5.10, 6.10 | 10 bit | 0000000000111111 | 16:10 |
| | | 1111222222222233 | |
| | | 3333333344444444 | |
| | | 4455555555556666 | |
| | | 6666667777777777 | |
| | | 8888888888999999 | |
| | | 9999AAAAAAAAABB | |
| | | BBBBBBBBCCCCCCCC | |
| | | CCDDDDDDDDDDEEEE | |
| | | EEEEEEFFFFFFFFFF | |
| 5.11, 6.11 | 11 bit | 0000000000011111 | 16:11 |
| | | 1111112222222222 | |
| | | 2333333333334444 | |
| | | 4444444555555555 | |
| | | 5566666666666777 | |
| | | 7777777788888888 | |
| | | 88899999999999AA | |
| | | AAAAAAAABBBBBBB | |
| | | BBBBCCCCCCCCCCCD | |
| | | DDDDDDDDDEEEEEE | |
| | | EEEEEFFFFFFFFFFF | |
| 5.12, 6.12 | 12 bit | 0000000000001111 | 16:12 |
| | | 1111112222222222 | |
| | | 2222333333333333 | |
| | | 4444444444445555 | |
| | | 5555555566666666 | |
| | | 6666777777777777 | |
| | | 8888888888889999 | |
| | | 99999999AAAAAAA | |
| | | AAAABBBBBBBBBBBB | |
| | | CCCCCCCCCCCCDDDD | |
| | | DDDDDDDDEEEEEEEE | |
| | | EEEEFFFFFFFFFFFF | |
| 5.13, 6.13 | 13 bit | 0000000000000111 | 16:13 |
| | | 1111111111222222 | |
| | | 2222222333333333 | |
| | | 3333444444444444 | |
| | | 4555555555555566 | |
| | | 6666666666677777 | |
| | | 7777777788888888 | |
| | | 8888899999999999 | |
| | | 99AAAAAAAAAAAAAB | |
| | | BBBBBBBBBBBBCCCC | |
| | | CCCCCCCCDDDDDDDD | |
| | | DDDDDDEEEEEEEEEE | |
| | | EEEFFFFFFFFFFFFF | |
| 5.14, 6.14 | 14 bit | 0000000000000011 | 16:14 |
| | | 1111111111112222 | |
| | | 2222222222333333 | |
| | | 3333333344444444 | |
| | | 4444445555555555 | |
| | | 5555666666666666 | |
| | | 6677777777777777 | |
| | | 8888888888888899 | |
| | | 999999999999AAAA | |
| | | AAAAAAAAAABBBBBB | |
| | | BBBBBBBBCCCCCCCC | |
| | | CCCCCCDDDDDDDDDD | |
| | | DDDDEEEEEEEEEEEE | |
| | | EEFFFFFFFFFFFFFF | |
| 5.15, 6.15 | 15 bit | 0000000000000001 | 16:15 |
| | | 1111111111111122 | |
| | | 2222222222222333 | |
| | | 3333333333334444 | |
| | | 4444444444455555 | |
| | | 5555555555666666 | |
| | | 6666666667777777 | |
| | | 7777777788888888 | |
| | | 8888888999999999 | |
| | | 999999AAAAAAAAAA | |
| | | AAAAAbBBBBBBBBBB | |
| | | BBBBCCCCCCCCCCCC | |
| | | CCCDDDDDDDDDDDDD | |
| | | DDEEEEEEEEEEEEEE | |
| | | EFFFFFFFFFFFFFFF | |
| 5.16, 6.16 | 16 bit | 0000000000000000 | 16:16 |
| | | 1111111111111111 | |
| | | 2222222222222222 | |
| | | 3333333333333333 | |
| | | 4444444444444444 | |
| | | 5555555555555555 | |
| | | 6666666666666666 | |
| | | 7777777777777777 | |
| | | 8888888888888888 | |
| | | 9999999999999999 | |
| | | AAAAAAAAAAAAAAAA | |
| | | BBBBBBBBBBBBBBBB | |
| | | CCCCCCCCCCCCCCCC | |
| | | DDDDDDDDDDDDDDDD | |
| | | EEEEEEEEEEEEEEEE | |
| | | FFFFFFFFFFFFFFFF | |

ALGORITHM 6: UNPACK A VECTOR

INPUT : P1..Pp, B, n

OUTPUT: A1..An or D1..Dn

Find the entry corresponding to B in the Unpacking Algorithm Look-up Table, and execute that algorithm.

| UNPACKING ALGORITHM LOOK-UP TABLE | |
|---|---|
| B | Algorithm |
| 0 | ALGORITHM 6.0 |
| 1 | ALGORITHM 6.1 |
| 2 | ALGORITHM 6.2 |
| 3 | ALGORITHM 6.3 |
| 4 | ALGORITHM 6.4 |
| 5 | ALGORITHM 6.5 |
| 6 | ALGORITHM 6.6 |
| 7 | ALGORITHM 6.7 |
| 8 | ALGORITHM 6.8 |
| 9 | ALGORITHM 6.9 |
| 10 | ALGORITHM 6.10 |
| 11 | ALGORITHM 6.11 |
| 12 | ALGORITHM 6.12 |
| 13 | ALGORITHM 6.13 |
| 14 | ALGORITHM 6.14 |
| 15 | ALGORITHM 6.15 |
| 16 | ALGORITHM 6.16 |

Each of these low level decompression algorithms consists of the shifts, ANDs and ORs needed to extract the original significant bits from the compressed data. Sign extension is performed to produce Bw bit values. Each algorithm expects the input vector to be in the pattern produced by the corresponding compression algorithm.

ALGORITHM 7: COMPRESS ONE VECTOR

INPUT : A1..An, n

OUTPUT: C1..Cm, m

Find min_data and max_data from A1..An, using ALGORITHM 1.

If min_data=max_data then m = 2
C1 = 0
C2 = A1

| 0 | A1 |
|---|----|
| C1 | C2 |

Otherwise, form the difference vector from the original points:

D1   = A2 − A1
D2   = A3 − A2
D3   = A4 − A3
.
.
.
D(n−1) = An − A(n−1)
Dn   = 0

| A1 | A2 | A3 | A4 | A5 | A6 | A7 | A8 | A9 | A10 | A11 | A12 | ⋯ | A(n−1) | An |
|----|----|----|----|----|----|----|----|----|-----|-----|-----|---|--------|----|

\ / \ / \ / \ / \ / \ / \ / \ / \ / \ / \ /                \ /
 ‾   ‾   ‾   ‾   ‾   ‾   ‾   ‾   ‾   ‾   ‾                  ‾

| D1 | D2 | D3 | D4 | D5 | D6 | D7 | D8 | D9 | D10 | D11 | ⋯⋯ | D(n−1) | 0 |
|----|----|----|----|----|----|----|----|----|-----|-----|-----|--------|---|

Find min_diff and max_diff from D1..D(n−1), using ALGORITHM 2.

Determine Ba from min data and max_data, using ALGORITHM 3.

Determine Bd from min diff and max_diff, using ALGORITHM 4.

If Ba<=Bd, then p=(n*Ba)/Bw m=p+1

Pack A1..An into P1..Pp using ALGORITHM 5 with B=Ba.

C1 = Ba
C2 = P1
C3 = P2
C4 = P3
.
.
.
Cm = Pp

| Ba | P1 | P2 | P3 | P4 | P5 | P6 | P7 | P8 | P9 | P10 | P11 | P12 | P13 | ⋯ | Pp |
|----|----|----|----|----|----|----|----|----|----|-----|-----|-----|-----|---|----|
| C1 | C2 | C3 | C4 | C5 | C6 | C7 | C8 | C9 | C10 | C11 | C12 | C13 | C14 | ⋯ | Cm |

If Bd<Ba, then p=(n,Bd)/Bw m=p+2 pack D1..Dn into P1..Pp using ALGORITHM 5 with B=Bd.

```
C1 = -Bd
C2 = A1
C3 = P1
C4 = P2
C5 = P3
  .
  .
  .
Cm = Pp
```

| -Bd | A1 | P1 | P2 | P3 | P4 | P5 | P6 | P7 | P8 | P9 | P10 | P11 | P12 | ... | Pp |
|-----|----|----|----|----|----|----|----|----|----|----|-----|-----|-----|-----|----|
| C1  | C2 | C3 | C4 | C5 | C6 | C7 | C8 | C9 | C10| C11| C12 | C13 | C14 | ... | Cm |

ALGORITHM 8: DECOMPRESS ONE VECTOR
   INPUT: C1..Cm, n
   OUTPUT: A1..An, m
   if C1=0, then
      The compressed vector is organized as follows:

| 0  | A1 |
|----|----|
| C1 | C2 |

Decompress by copying the point to each output word:

```
A1 = C2
A2 = C2
A3 = C2
  .
  .
  .
An = C2
```

| C2 | C2 | C2 | C2 | C2 | C2 | C2 | C2 | C2 | C2 | C2 | C2 | C2 | C2 | ... | C2 |
|----|----|----|----|----|----|----|----|----|----|----|----|----|----|-----|----|
| A1 | A2 | A3 | A4 | A5 | A6 | A7 | A8 | A9 | A10| A11| A12| A13| A14| ... | An | if C1>=0, then
   The compressed vector is organized as follows, where

```
p = (n*C1)/Bw
m = p + 1
```

| Ba | P1 | P2 | P3 | P4 | P5 | P6 | P7 | P8 | P9 | P10 | P11 | P12 | P13 | ... | Pp |
|----|----|----|----|----|----|----|----|----|----|-----|-----|-----|-----|-----|----|
| C1 | C2 | C3 | C4 | C5 | C6 | C7 | C8 | C9 | C10| C11 | C12 | C13 | C14 | ... | Cm |

Unpack P1..Pp into A1..An using ALGORITHM 6 with
      B=Ba.

| A1 | A2 | A3 | A4 | A5 | A6 | A7 | A8 | A9 | A10| A11| A12| A13| A14| ... | An |
|----|----|----|----|----|----|----|----|----|----|----|----|----|----|-----|----|
| A1 | A2 | A3 | A4 | A5 | A6 | A7 | A8 | A9 | A10| A11| A12| A13| A14| ... | An | if C1 <0, then.
   The compressed vector is organized as follows, where p = (n*(-C1))/Bw
m = p + 2

| -Bd | A1 | P1 | P2 | P3 | P4 | P5 | P6 | P7 | P8 | P9 | P10 | P11 | P12 | ... | Pp |
|-----|----|----|----|----|----|----|----|----|----|----|-----|-----|-----|-----|----|
| C1  | C2 | C3 | C4 | C5 | C6 | C7 | C8 | C9 | C10| C11| C12 | C13 | C14 | ... | Cm |

Unpack P1..Pp into D1..Dn using ALGORTTHM 6 with B=-Bd.

Form the original vector from the difference vector, as follows:

A1 = C2
A2 = A1 + D1
A3 = A2 + D2
A4 = A3 + D3
.
.
.
An = A(n-1) + D(n-1)

| D1 | D2 | D3 | D4 | D5 | D6 | D7 | D8 | D9 | D10 | D11 | ..... | D(n-1) | 0 |

D1  D2  D3  D4  D5  D6  D7  D8  D9  D10  D11  .....  D(n-1)  Dn
 |   |   |   |   |   |   |   |   |   |    |               |
 +-  +-  +-  +-  +-  +-  +-  +-  +-  +-   +-              +-
  \|  \|  \|  \|  \|  \|  \|  \|  \|  \|   \               | \

| C2 | A3 | A4 | A5 | A6 | A7 | A8 | A9 | A10 | A11 | A12 | ... | A(n-1) | An |

A1  A2  A3  A4  A5  A6  A7  A8  A9  A10  A11  A12  ...  A(n-1)  An

What is claimed is:

1. Apparatus for compressing a data vector of a predetermined number of data points comprising:

a memory;

a first comparator for determining a largest and smallest data point of the data vector; and a second comparator for determining if the largest and smallest data points are equal and when they are, causing a first data point of the data vector to be stored in the memory as the compressed data vector.

2. The apparatus as in claim 1 further comprising a processor for storing the compressed vector in an adjacent memory location of a previous compressed vector.

3. The apparatus as in claim 2 further comprising a second processor for decompressing the compressed vector by reading the compressed vector and writing the data point of the compressed vector in each location of the data vector buffer having the predetermined number of data point memory locations.

4. The apparatus as in claim 3 further comprising a third processor for outputting the contents of the data vector buffer as decompressed data.

5. Apparatus for compressing a data vector of a predetermined number of data points comprising:

a memory for storing the compressed data vector;

a first processor for determining a data field width necessary to uniquely describe a largest relative magnitude data point; and a second processor for storing the data points of the data vector as the compressed vector in data fields of memory of the data field width.

6. The apparatus as in claim 5 wherein the processor for determining the data field width further comprises a look-up table providing data field width based upon data point magnitude.

7. The apparatus as in claim 5 further comprising a third processor for storing the compressed vectors in adjacent memory locations.

8. The apparatus as in claim 5 further comprising a fourth processor for decompressing the compressed vectors by reading the compressed vector and writing the stored fields of the determined field size of the compressed vector into corresponding locations of the data vector buffer having the predetermined number of data point memory locations.

9. The apparatus as in claim 8 further comprising a fifth processor for outputting the contents of the data vector buffer as decompressed data.

10. Apparatus for compressing a data vector of a predetermined number of data points comprising:

a memory for storing the compressed data vector;

a comparator and register for creating a difference vector of difference values of adjacent data points of the data vector;

a first processor for determining a data field width necessary to uniquely describe a largest magnitude difference value of the difference vector;

a second processor for storing the difference points of the difference vector as the compressed vector in data fields of the memory of the determined field width along with a magnitude and sign of the first data point of the data vector.

11. The apparatus as in claim 10 wherein the first processor for determining the data field width further comprises a look-up table providing data field width based upon data point magnitude.

12. The apparatus as in claim 10 further comprising a third processor for storing an indicia of format along with each compressed vector.

13. The apparatus as in claim 10 further comprising a fourth processor for storing the compressed vectors in adjacent memory locations.

14. The apparatus as in claim 13 further comprising a fifth processor for decompressing the compressed vectors stored in the memory by retrieving the first data point of the compressed data vector and storing the first point in the first data location of the data vector buffer.

15. The apparatus as in claim 14 further comprising a sixth processor for retrieving a first difference from the difference vector of the compressed vector, summing with the first data point and storing in the second data point location of the data vector buffer.

16. The apparatus as in claim 15 further comprising a seventh processor for retrieving a next difference point of the difference vector of the compressed vector, summing with the previously stored data point and storing in the next data point of the data vector buffer.

17. The apparatus as in claim 16 further comprising an eighth processor for outputting the contents of the data vector buffer as decompressed data.

18. Apparatus for compressing data vectors of a predetermined number of data points comprising:
    a memory for storing the compressed data vectors;
    a first comparator for determining a largest and smallest data point of a data vector of the data vectors;
    a second comparator for determining if the largest and smallest data points are equal, and if they are, causing a first data point of the data vector to be stored in the memory as the compressed data vector of a first format;
    a first processor for determining a first data field width necessary to uniquely describe the largest magnitude data point;
    a third comparator and register for creating a difference vector of difference values of adjacent data points of the data vector;
    a second processor for determining a second data field width necessary to uniquely describe a largest magnitude difference value of the difference vector;
    a third processor for storing the data points of the data vector as the compressed vector of a second format in data fields of the memory of the determined first data field width when the first data field width is less than or equal to the second data field width; and
    a fourth processor for storing the difference points of the difference vector as the compressed vector of a third format in data fields of the memory of the determined second field width along with a magnitude and sign of the first data point of the data vector.

19. The apparatus as in claim 18 wherein the first and second processor for determining the first and second data field width further comprises a look-up table providing data field width based upon data point magnitude.

20. The apparatus as in claim 18 further comprising a fifth processor for storing an indicia of format along with each compressed vector.

21. The apparatus as in claim 18 further comprising a sixth processor for storing the compressed vectors in adjacent memory locations.

22. The apparatus as in claim 18 further comprising a seventh processor for decompressing the compressed vectors by reading a compressed vector from memory and determining a compressed vector format by reference to the indicia of format.

23. The apparatus as in claim 18 further comprising a eighth processor for decompressing the compressed vector by reading a compressed vector stored under the first format from memory and writing the data point stored in each location of a decompression data vector buffer having the predetermined number of data point memory locations.

24. The apparatus as in claim 23 further comprising a ninth processor for decompressing the compressed vectors stored under the second format by reading a compressed vector and writing the stored fields of the first field size into corresponding locations of the data vector buffer having the predetermined number of data point memory locations.

25. The apparatus as in claim 24 further comprising a tenth processor for decompressing the compressed vectors stored under the third format by retrieving the first data point of the compressed data vector and storing the first data point in the first data location of the data vector buffer.

26. The apparatus as in claim 25 further comprising a eleventh processor for retrieving a first difference from the difference vector of the compressed vector, summing with the first data point and storing in the second data point of the data vector buffer.

27. The apparatus as in claim 26 further comprising an twelfth processor for retrieving a next difference point of the difference vector from the difference vector of the compressed vector, summing with the previously stored data point and storing in the next data point location of the data vector buffer.

28. The apparatus as in claim 27 further comprising a thirteenth processor for outputting the contents of the data vector buffer as decompressed data.

29. A method of compressing data vectors of a predetermined length comprising the steps of:
    determining a largest and smallest relative data point within a data vector of the data vectors and when they are equal, storing a first data point as the compressed vector of a first format;
    determining a first data field width necessary to uniquely describe the largest magnitude data point
    creating a difference vector of difference points of adjacent data points within the data vector;
    determining a second data field width necessary to uniquely describe a largest magnitude difference value of the difference vector;
    when the first data field width is less than or equal to the second data field width, storing the data points of the data vector in data fields of the first data field width; and
    otherwise, storing the difference points of the difference vector in data fields of the second field width along with a magnitude and sign of the first data field.

30. The method as in claim 29 further comprising the step of storing indicia of compression format with the stored data vector.

31. The method as in claim 29 wherein the step of storing the data points of the data vector in data fields of the first data field width further comprising the step the arranging the data points of the data vector in adjacent data fields.

32. The method as in claim 29 wherein the step of storing the difference points of the difference vector in data fields of the second data field width further comprising the step the arranging the difference points of the difference vector in adjacent data fields.

33. An apparatus for compressing data vectors of a predetermined length comprising:
    means for determining a largest and smallest relative data point within a data vector of the data vectors and when they are equal, storing a first data point as the compressed vector of a first format;

means for determining a first data field width necessary to uniquely describe the largest magnitude data point means for creating a difference vector of difference points of adjacent data points within the data vector;

means for determining a second data field width necessary to uniquely describe a largest magnitude difference value of the difference vector;

memory for storing the data points of the data vector in data fields of the first data field width when the first data field width is less than or equal to the second data field width; and, otherwise, storing the difference points of the difference vector in data fields of the second field width along with a magnitude and sign of the first data field.

34. The apparatus as in claim 33 further comprising means for storing indicia of compression format with the stored data vector.

35. The apparatus as in claim 33 wherein the means for storing the data points of the data vector in data fields of the first data field width further comprises means for arranging the data points of the data vector in adjacent data fields.

36. The apparatus as in claim 33 wherein the means for storing the difference points of the difference vector in data fields of the second data field width further comprises means for arranging the difference points of the difference vector in adjacent data fields.

* * * * *